United States Patent
Yu et al.

(10) Patent No.: US 8,935,551 B2
(45) Date of Patent: Jan. 13, 2015

(54) SUPPLY VOLTAGE GENERATOR FOR A DISPLAY TIMING CONTROLLER WITH CURRENT REUSE

(75) Inventors: Wang Yu, Seoul (KR); Jae-Youl Lee, Hwaseong-si (KR); Jae-Jin Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 266 days.

(21) Appl. No.: 13/475,043

(22) Filed: May 18, 2012

(65) Prior Publication Data

US 2012/0319765 A1 Dec. 20, 2012

(30) Foreign Application Priority Data

Jun. 17, 2011 (KR) .................. 10-2011-0059199

(51) Int. Cl.
*G06F 1/32* (2006.01)
*G09G 5/00* (2006.01)
*H03K 19/00* (2006.01)
*G09G 3/36* (2006.01)
*G06F 1/26* (2006.01)
*G09G 3/38* (2006.01)

(52) U.S. Cl.
CPC .......... *H03K 19/0013* (2013.01); *G09G 3/3611* (2013.01); *G06F 1/26* (2013.01); *G09G 3/38* (2013.01)
USPC ............................. 713/320; 345/212; 345/213

(58) Field of Classification Search
CPC ........... G09G 3/38; G09G 3/3611; G06F 1/26
USPC .................................... 713/320; 345/212, 213
See application file for complete search history.

(56) References Cited

U.S. PATENT DOCUMENTS

| | | | |
|---|---|---|---|
| 5,798,741 A | 8/1998 | Kajihara | |
| 2004/0239189 A1 | 12/2004 | Sundstrom | |
| 2008/0122826 A1* | 5/2008 | Tung et al. | 345/211 |
| 2010/0033463 A1* | 2/2010 | Nishimura et al. | 345/211 |
| 2010/0156917 A1 | 6/2010 | Lee et al. | |
| 2010/0164936 A1 | 7/2010 | Park et al. | |
| 2010/0283777 A1* | 11/2010 | Sang et al. | 345/212 |
| 2012/0056864 A1* | 3/2012 | Aioanei | 345/212 |

FOREIGN PATENT DOCUMENTS

| | | |
|---|---|---|
| KR | 2004-0020916 A | 3/2004 |
| KR | 2010-00079189 A | 7/2010 |
| KR | 20100073029 A | 7/2010 |

\* cited by examiner

*Primary Examiner* — Ji H Bae
(74) *Attorney, Agent, or Firm* — Harness, Dickey & Pierce, P.L.C.

(57) ABSTRACT

A semiconductor IC including a supply voltage generator, one or more first circuit blocks, and one or more second circuit blocks. The supply voltage generator is configured to generate a first supply voltage and a second supply voltage based on an external supply voltage, and to provide the first supply voltage to a first power bus and the second supply voltage to a second power bus. The first circuit blocks are connected between the first power bus and the second power bus, and the second circuit blocks are connected between the second power bus and ground.

14 Claims, 4 Drawing Sheets ations, ...

SUPPLY VOLTAGE GENERATOR FOR A DISPLAY TIMING CONTROLLER WITH CURRENT REUSE

CROSS-REFERENCE TO RELATED APPLICATION

This application claims priority under 35 U.S.C. §119 to Korean Patent Application No. 10-2011-0059199 filed on Jun. 17, 2011, the disclosure of which is hereby incorporated by reference in its entirety.

BACKGROUND

1. Field

Embodiments of the inventive concepts relate to a semiconductor integrated circuit (IC) and/or a power supply method of the same, and more particularly, to a semiconductor IC having a power supply structure capable of reducing power consumption and/or a power supply method of the semiconductor IC.

2. Description of Related Art

Research is being conducted to reduce the power consumption of electronics, especially, displays. In particular, research aimed at reducing the power consumption of respective circuit blocks of semiconductor ICs included in electronics is underway.

SUMMARY

At least one example embodiment of the inventive concepts provide a semiconductor integrated circuit (IC) having a power supply structure capable of reducing power consumption.

At least one example embodiment of the inventive concepts may also provide a method of supplying power to a semiconductor IC having a power supply structure capable of reducing power consumption.

At least one example embodiment of the inventive concepts may also provide a timing controller of a display having a power supply structure capable of reducing power consumption.

In one or more embodiment, a semiconductor IC may include a supply voltage generator, one or more first circuit blocks, and one or more second circuit blocks.

The supply voltage generator may generate a first supply voltage and a second supply voltage based on an external supply voltage, and may provide the first supply voltage to a first power bus and the second supply voltage to a second power bus. The first circuit blocks are connected between the first power bus and the second power bus, and the second circuit blocks are connected between the second power bus and ground.

In at least one example embodiment, the supply voltage generator may include one or more low-voltage regulators. The semiconductor IC may be a timing controller of a display. The first circuit blocks may include an oscillator, and the second circuit blocks may include a control signal generating circuit and an output circuit.

In at least one example embodiment, the output circuit may be a reduced voltage differential signaling (RVDS) driver circuit. The RVDS driver circuit may include a first RVDS driver circuit and a second RVDS driver circuit connected in a cascade between the second supply voltage and ground. The RVDS driver circuit may include: a first RVDS driver circuit connected between the second supply voltage and a first node; a first regulator connected between the first node and a second node; a second RVDS driver circuit connected between the second node and a third node; and a second regulator connected between the third node and ground.

In at least one example embodiment, the first regulator may provide a same magnitude of voltage to the first node and the second node.

In at least one example embodiment, the timing controller may generate a gate driver control signal and a source driver control signal based on input data, and may provide the gate driver control signal and the source driver control signal to a gate driver and a source driver of the display, respectively.

In accordance with another embodiment, a method of supplying power to a semiconductor IC, the semiconductor IC may include one more more first circuit blocks connected between a first power bus and a second power bus and one or more second circuit blocks connected between a second power bus and a ground, the method including: generating a first supply voltage and a second supply voltage based on an external supply voltage; applying the first supply voltage to a first power bus; applying the second supply voltage to a second power bus.

In accordance with another aspect of the inventive concept, a display may include a timing controller, a gate driver, a source driver, and a display panel.

The timing controller may generate a gate driver control signal and a source driver control signal on the basis of input data, and may provide the gate driver control signal and the source driver control signal to the gate driver and the source driver of the display, respectively. Also, the timing controller may include first circuit blocks connected between a first power bus and a second power bus, and second circuit blocks connected between the second power bus and ground.

In accordance with another embodiment, a semiconductor IC may include at least first and second circuit blocks, the first circuit blocks may be electrically coupled to a first power bus and a second power bus, and the second circuit blocks may be electrically coupled to a second power bus and a ground.

BRIEF DESCRIPTION OF THE DRAWINGS

The foregoing and other features and advantages of the inventive concepts will be apparent from the more particular description of example embodiments of the inventive concepts, as illustrated in the accompanying drawings, throughout which like reference numerals denote like elements. The drawings are not necessarily to scale, emphasis instead being placed upon illustrating the principles of the inventive concepts. In the drawings.

DETAILED DESCRIPTION OF THE EMBODIMENTS

Figure 1:
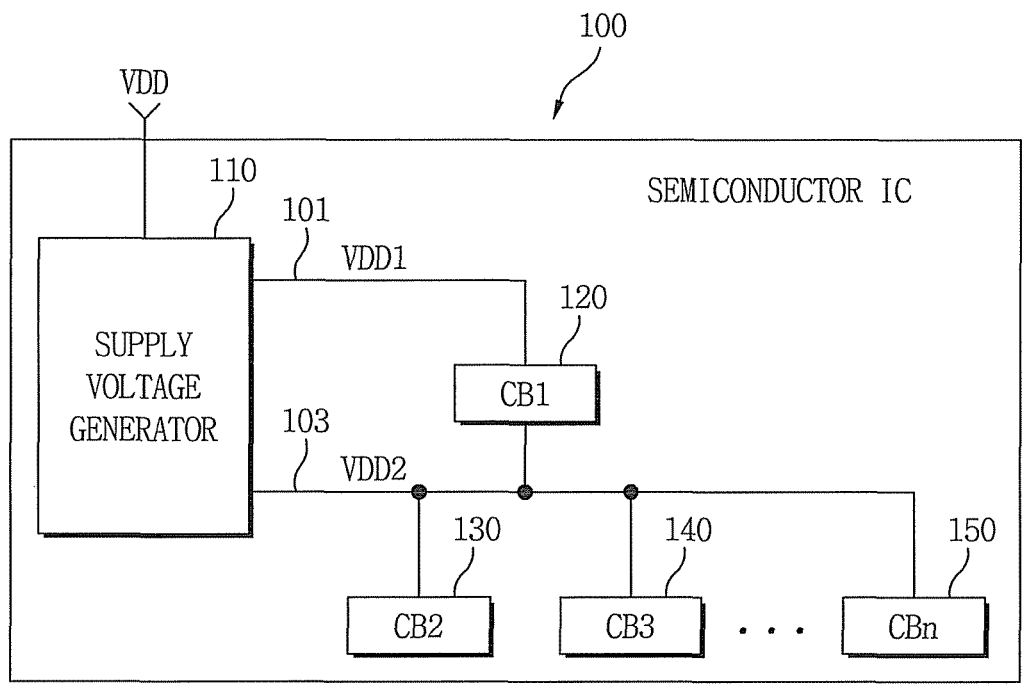
FIG. 1 is a block diagram of a semiconductor integrated circuit (IC) including a power supply structure according to an example embodiment of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concepts to those skilled in the art.

It will be understood that when an element or layer is referred to as being "on," "connected to" or "coupled with" another element or layer, it can be directly on, connected or coupled with the other element or layer or intervening elements or layers may be present. In contrast, when an element is referred to as being "directly on," "directly connected to" or "directly coupled with" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, quantities, steps, operations, elements, and/or components, but do not preclude the presence or addition of one or more other features, quantities, steps, operations, elements, components, and/or groups thereof.

Unless otherwise defined, all terms (including technical and scientific terms) used herein have the same meanings as commonly understood by one of ordinary skill in the art to which the inventive concepts belong. It will be further understood that terms in common usage should be interpreted within the context of the relevant art and not in an idealized or overly formal sense unless expressly so defined herein.

In some alternative implementations, the functions/acts noted in the blocks may occur out of the order noted in the flowcharts. For example, two blocks shown in succession may in fact be executed substantially concurrently, or the blocks may sometimes be executed in the reverse order, depending upon the functionality/acts involved.

Hereinafter, example embodiments of the inventive concepts will be described with reference to the drawings.

FIG. 1 is a block diagram of a semiconductor integrated circuit (IC) 100 having a power supply structure according to an example embodiment of the inventive concept.

Referring to FIG. 1, the semiconductor IC 100 includes a supply voltage generator 110, a first circuit block 120, and second circuit blocks 130, 140 and 150.

The supply voltage generator 110 may generate a first supply voltage VDD1 and a second supply voltage VDD2 on the basis of an external supply voltage VDD, and may provide the first supply voltage VDD1 to a first power bus 101 and the second supply voltage VDD2 to a second power bus 103. The first circuit block 120 is connected between the first power bus 101 and the second power bus 103, and the second circuit blocks 130, 140 and 150 are connected between the second power bus 103 and ground (not shown).

Figure 2:
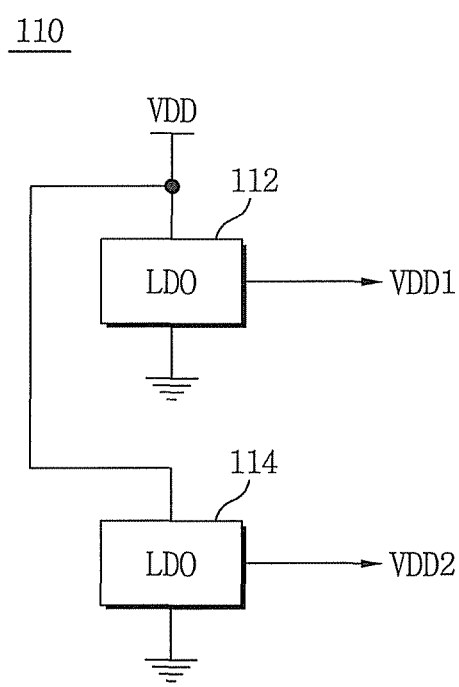
FIG. 2 is a block diagram of an example of a supply voltage generator included in the semiconductor IC of FIG. 1.

FIG. 2 is a block diagram of an example of the supply voltage generator 110 included in the semiconductor IC 100 of FIG. 1.

Referring to FIG. 2, the supply voltage generator 110 may include one or more low-voltage regulators 112 and 114. The first low-voltage regulator 112 may generate the first supply voltage VDD1, and the second low-voltage regulator 114 may generate the second supply voltage VDD2.

Figure 3:
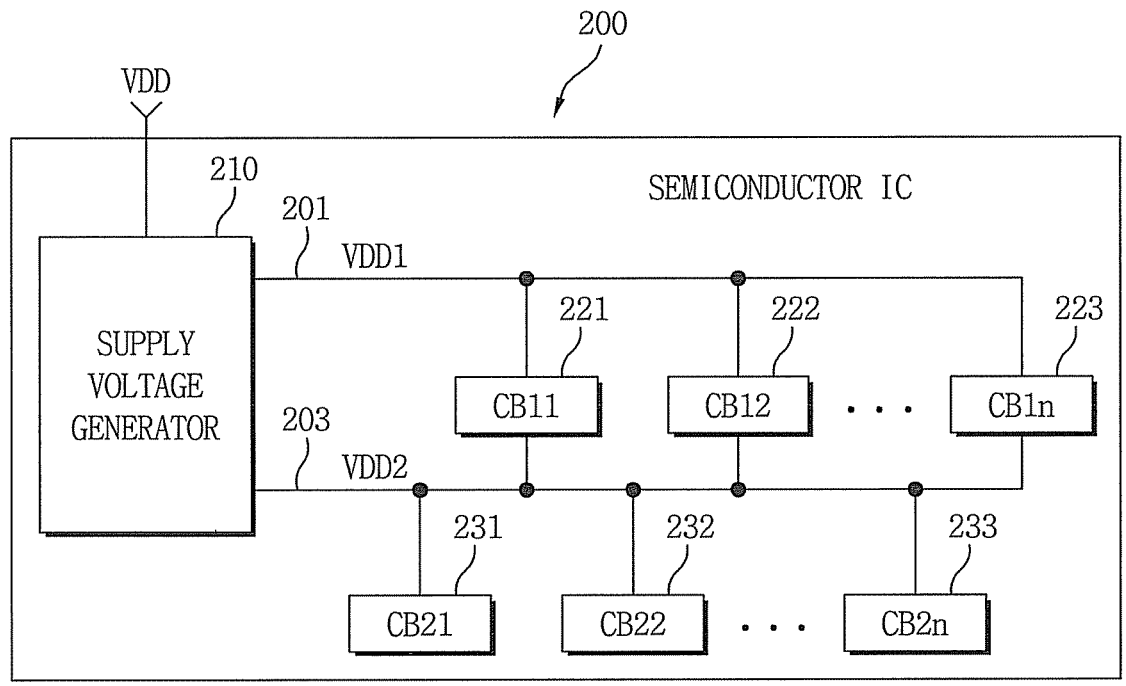
FIG. 3 is a block diagram of a semiconductor IC having a power supply structure according to another example embodiment of the inventive concept.

FIG. 3 is a block diagram of a semiconductor IC 200 having a power supply structure according to another example embodiment of the inventive concepts.

Referring to FIG. 3, the semiconductor IC 200 includes a supply voltage generator 210, first circuit blocks 221, 222 and 223, and second circuit blocks 231, 232 and 233.

The supply voltage generator 210 may generate a first supply voltage VDD1 and a second supply voltage VDD2 on the basis of an external supply voltage VDD, and may provide the first supply voltage VDD1 to a first power bus 201 and the second supply voltage VDD2 to a second power bus 203. The first circuit blocks 221, 222 and 223 are connected between the first power bus 201 and the second power bus 203, and the second circuit blocks 231, 232 and 233 are connected between the second power bus 203 and ground (not shown).

Figure 4:
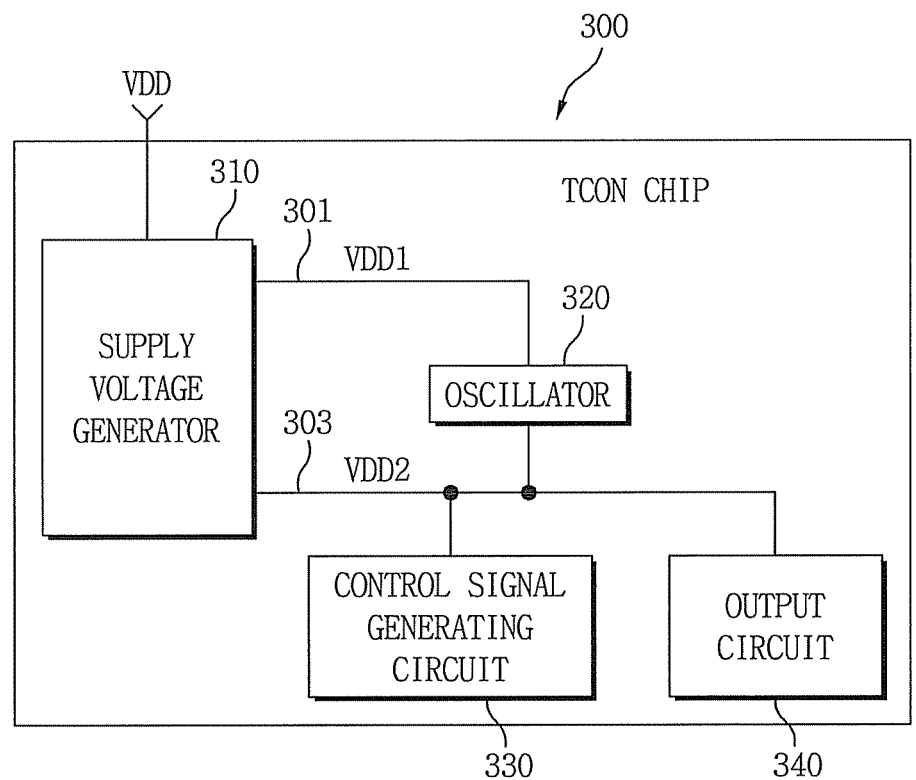
FIG. 4 is a block diagram of a timing controller having a power supply structure according to an example embodiment of the inventive concept.

FIG. 4 is a block diagram of a timing controller 300 having a power supply structure according to an example embodiment of the inventive concepts.

Referring to FIG. 4, the timing controller 300 includes a supply voltage generator 310, an oscillator 320, a control signal generating circuit 330, and an output circuit 340.

The supply voltage generator 310 may generate a first supply voltage VDD1 and a second supply voltage VDD2 on the basis of an external supply voltage VDD, and may provide the first supply voltage VDD1 to a first power bus 301 and the second supply voltage VDD2 to a second power bus 303. The oscillator 320, which may generate an oscillating signal, is connected between the first power bus 301 and the second power bus 303, and the control signal generating circuit 330 and the output circuit 340 are connected between the second power bus 303 and ground (not shown).

In the timing controller 300 of FIG. 4, the first supply voltage VDD1 may be 2.4V, and the second supply voltage VDD2 may be 1.2V.

There may be differences in power consumption among circuit blocks included in the timing controller chip. Circuit blocks having large power consumption may be connected between the first power bus 301 and the second power bus 303, and circuit blocks having small power consumption may be connected between the second power bus 303 and ground. In the timing controller 300 shown in FIG. 4, circuit blocks between the supply voltage and ground are cascaded to form a current path, and a current-reuse technique is used to reduce power consumption.

Figure 5:
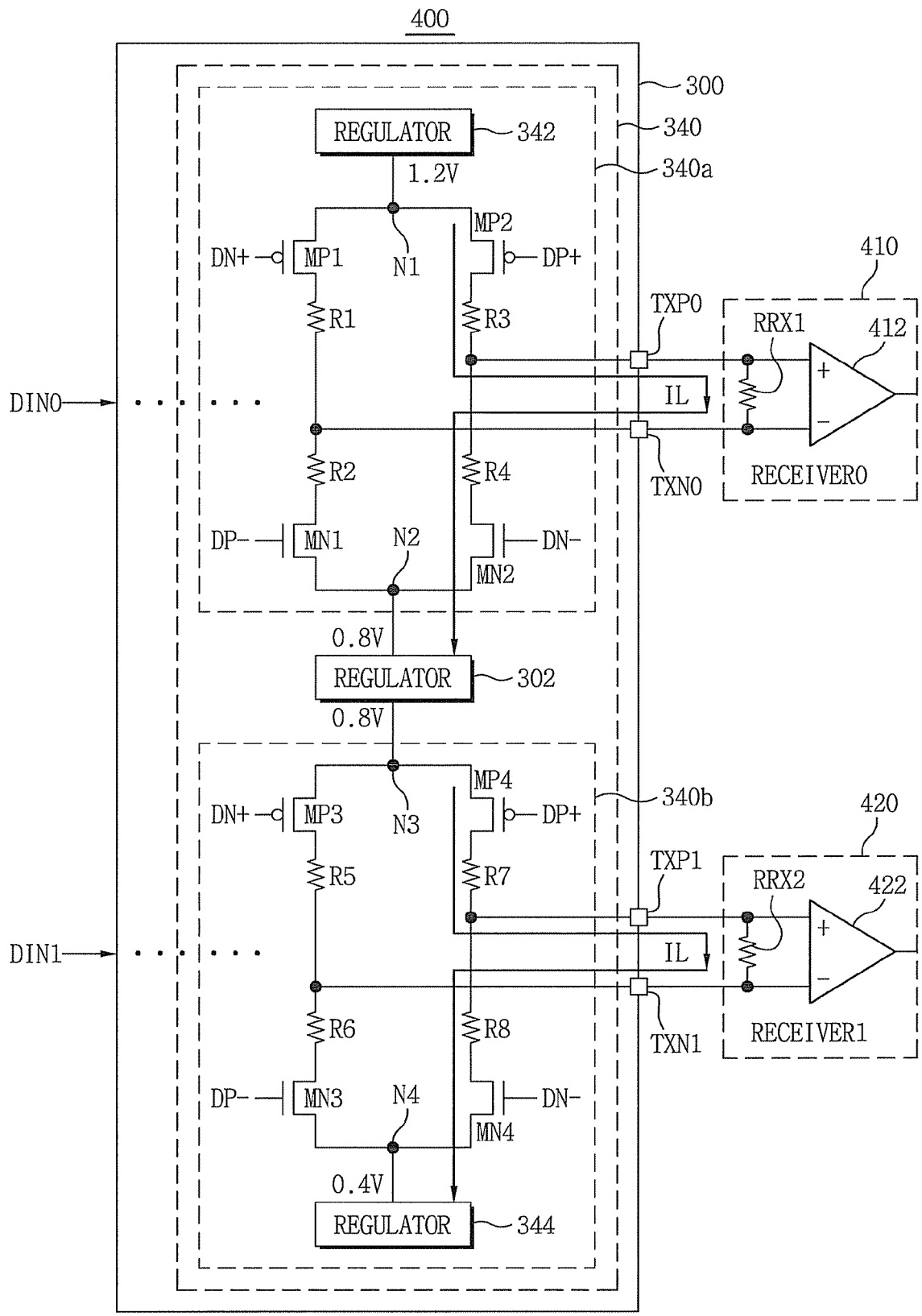
FIG. 5 is a circuit diagram of an example of a communication system including the output circuit of the timing controller of FIG. 4.

FIG. 5 is a circuit diagram of an example of a communication system 400 including the timing controller 300 of FIG. 4. For ease of understanding and description, only the output circuit 340 of the timing controller 300 is shown in FIG. 5.

Referring to FIG. 5, the communication system 400 includes the timing controller 300, a first receiver 410, and a second receiver 420. The timing controller 300 includes a reduced voltage differential signaling (RVDS) driver circuit that corresponds to the output circuit 340 of FIG. 4. The RVDS driver circuit may include a first RVDS driver circuit 340a, a first regulator 302, and a second RVDS driver circuit 340b.

The first RVDS driver circuit 340a may include a second regulator 342, a first p-channel metal oxide semiconductor (PMOS) transistor MP1 operating in response to a first input signal DN+, a second PMOS transistor MP2 operating in response to a second input signal DP+, a first resistor R1, a second resistor R2, a third resistor R3, a fourth resistor R4, a first n-channel metal oxide semiconductor (NMOS) transistor MN1 operating in response to a third input signal DP−, and a second NMOS transistor MN2 operating in response to a fourth input signal DN−.

The second RVDS driver circuit 340b may include a third PMOS transistor MP3 operating in response to the first input signal DN+, a fourth PMOS transistor MP4 operating in response to the second input signal DP+, a fifth resistor R5, a sixth resistor R6, a seventh resistor R7, an eighth resistor R8, a third NMOS transistor MN3 operating in response to the third input signal DP−, a fourth NMOS transistor MN4 operating in response to the fourth input signal DN−, and a third regulator 344.

The first RVDS driver circuit 340a may constitute a first channel, and the second RVDS driver circuit 340b may constitute a second channel. A connection point between the third resistor R3 and the fourth resistor R4 is connected to a first pin TXP0, and a connection point between the first resistor R1 and the second resistor R2 is connected to a second pin TXN0. A first output signal is output from the connection point between the third resistor R3 and the fourth resistor R4, and a second output signal is output from the connection point between the first resistor R1 and the second resistor R2. The first output signal and the second output signal constitute a differential output signal pair.

A connection point between the seventh resistor R7 and the eighth resistor R8 is connected to a third pin TXP1, and a connection point between the fifth resistor R5 and the sixth resistor R6 is connected to a fourth pin TXN1. A third output signal is output from the connection point between the seventh resistor R7 and the eighth resistor R8, and a fourth output signal is output from the connection point between the fifth resistor R5 and the sixth resistor R6. The third output signal and the fourth output signal constitute a differential output signal pair.

The first receiver 410 includes a resistor RRX1 and a differential amplifier 412, and receives the output signal pair of the first RVDS driver circuit 340a, that is, the first channel. The second receiver 420 includes a resistor RRX2 and a differential amplifier 422, and receives the output signal pair of the second RVDS driver circuit 340b, that is, the second channel.

The second regulator 342 shown as included in the first RVDS driver circuit 340a may be instead included in the supply voltage generator 310 included in the timing controller 300 of FIG. 4. The first RVDS driver circuit 340a is connected between a first node N1 supplied with the second supply voltage VDD2 (1.2V) and a second node N2, and the first regulator 302 is connected between the second node N2 and a third node N3. The second RVDS driver circuit 340b is connected between the third node N3 and ground. In FIG. 5, the third regulator 344 is included in the second RVDS driver 340b, but may be disposed outside the second RVDS driver circuit 340b. When the third regulator 344 is disposed outside the second RVDS driver circuit 340b, the second RVDS driver 340b may be connected between the third node N3 and a fourth node N4, and the third regulator 344 may be connected between the fourth node N4 and ground.

The first regulator 302 may provide the same magnitude of voltage to the second node N2 and the third node N3. In the example of FIG. 5, the first regulator 302 provides 0.8V to the second node N2 and the third node N3. Also, in the example of FIG. 5, the third regulator 344 provides 0.4V to the fourth node N4. The first regulator 302 may maintain the second node N2 and the third node N3 at the same magnitude of voltage.

An RVDS driver circuit may drive a voltage signal and sense a voltage signal. In the communication system 400 of FIG. 5, the timing controller 300 may process the input signals DIN0 and DIN1; and the RVDS driver circuits 340a and 340b included in the timing controller 300 may provide output data to the receivers 410 and 420 through the pins TXP0, TXP1, TXN0 and TXN1.

As shown in FIG. 5, direct current (DC) of the first RVDS driver circuit 340a flows from the first node N1 to the second node N2 and the first regulator 302 through the MOS transistors MP2 and MN2 and the resistors R3 and R4. DC of the second RVDS driver circuit 340b flows from the third node N3 to the fourth node N4 and the third regulator 344 through the MOS transistors MP4 and MN4 and the resistors R7 and R8.

In the timing controller 300 shown in FIG. 5, the first RVDS driver circuit 340a and the second RVDS driver circuit 340b are cascaded, and thus power consumption may be reduced in comparison to a non-cascaded configuration.

Figure 6:
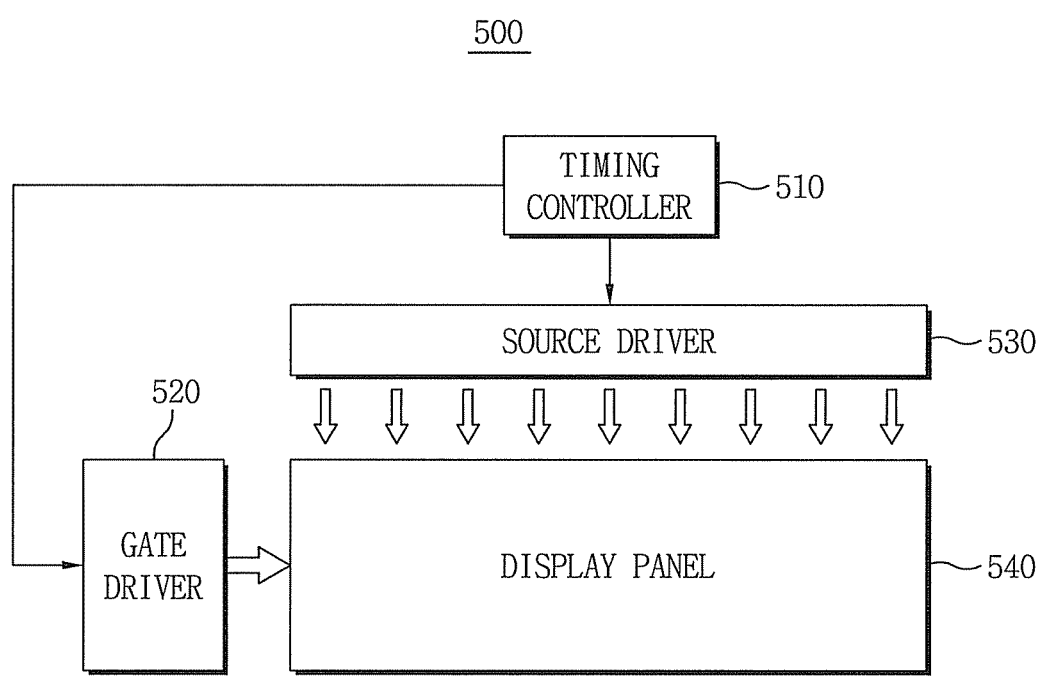
FIG. 6 is a block diagram of an example of a display including a timing controller according to one or more example embodiments of the inventive concept.

FIG. 6 is a block diagram of an example of a display 500 including a timing controller according to one or more example embodiments of the inventive concept.

Referring to FIG. 6, the display 500 includes a timing controller 510, a gate driver 520, a source driver 530, and a display panel 540.

The timing controller 510 may generate a gate driver control signal and a source driver control signal based on input data. The timing control signals and pixel data may be provided to the gate driver 520 and the source driver 530 of the display 500. Also, the timing controller 510 may have the circuit constitution shown in FIG. 1, 3 or 4. For example, the timing controller 510 includes first circuit blocks connected between a first power bus and a second power bus, and second circuit blocks connected between the second power bus and ground. Thus, in the timing controller 510, circuit blocks are cascaded between a supply voltage and ground, and power consumption may be reduced in comparison to a non-cascaded configuration.

The gate driver 520 may activate a scan line in response to the gate driver control signal. The source driver 530 outputs the pixel data to segments of the activated scan line.

Thus far, a power supply circuit and method of a timing controller of a display have been mainly described, however example embodiments of the inventive concepts may be applied to general semiconductor ICs.

A semiconductor IC according to embodiments of the inventive concepts includes first circuit blocks connected between a first power bus and a second power bus, and second circuit blocks connected between the second power bus and ground. Thus, in the semiconductor IC and a timing controller according to one or more example embodiments, circuit blocks are cascaded between a supply voltage and ground, and the power consumption of the semiconductor IC is reduced.

Example embodiments can be applied to a semiconductor IC and a display including a semiconductor IC.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of the inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various embodiments and not to be construed as limiting of the inventive concepts to the specific embodiments disclosed, and that modifications to the disclosed embodiments, as well as other embodiments, are intended to be included within the scope of the appended claims.

What is claimed is:

1. A semiconductor integrated circuit (IC) configured as a timing controller of a display, the semiconductor IC comprising:
   a supply voltage generator circuit configured to generate a first supply voltage and a second supply voltage based on an external supply voltage, and to provide the first supply voltage to a first power bus and the second supply voltage to a second power bus;
   one or more first circuit blocks connected between the first power bus and the second power bus; and
   one or more second circuit blocks connected between the second power bus and ground, wherein
      the first circuit blocks include an oscillator, and
      the second circuit blocks include a control signal generating circuit and an output circuit.

2. The semiconductor IC of claim 1, wherein the supply voltage generator circuit includes one or more low-voltage regulators.

3. The semiconductor IC of claim 1, wherein the output circuit is a reduced voltage differential signaling (RVDS) driver circuit.

4. The semiconductor IC of claim 3, wherein the RVDS driver circuit includes a first RVDS driver circuit and a second RVDS driver circuit connected in a cascade between the second supply voltage and the ground.

5. The semiconductor IC of claim 3, wherein the RVDS driver circuit includes:
   a first RVDS driver circuit connected between the second supply voltage and a first node;
   a first regulator connected between the first node and a second node;
   a second RVDS driver circuit connected between the second node and a third node; and
   a second regulator connected between the third node and the ground.

6. The semiconductor IC of claim 5, wherein the first regulator provides a same magnitude of voltage to the first node and the second node.

7. The semiconductor IC of claim 1, wherein the timing controller is configured to generate a gate driver control signal and a source driver control signal based on input data, and is configured to provide the gate driver control signal and the source driver control signal to a gate driver and a source driver of the display, respectively.

8. The semiconductor IC of claim 1, wherein the one or more second circuit blocks are not directly connected to the first power bus.

9. The semiconductor IC of claim 1, wherein the one or more first circuit blocks are upstream from the one or more second circuit blocks in a current path such that a current supplied to the one or more second circuit blocks is commonly guided upstream in a current reuse technique to the one or more first circuit blocks.

10. A semiconductor integrated circuit (IC), comprising:
   at least first and second circuit blocks, wherein
      the first circuit blocks are electrically coupled to a first power bus and a second power bus,
      the second circuit blocks are electrically coupled to the second power bus and a ground,
      the first circuit blocks include an oscillator electrically coupled to the first power bus, and
      the second circuit blocks include an output circuit, the output circuit including a first regulator electrically coupled between a first driver circuit and a second driver circuit, the first driver circuit including a second regulator electrically coupled to the second power bus and the second driver circuit including a third regulator electrically coupled to a ground.

11. The semiconductor IC of claim 10, further comprising:
   a supply voltage generator circuit configured to generate a first supply voltage and a second supply voltage, and provide the first supply voltage to the first power bus and the second supply voltage to the second power bus.

12. The semiconductor IC of claim 10, wherein a current path between the oscillator and the output circuit forms a cascade between the first power bus and the ground.

13. The semiconductor IC of claim 10, wherein the second circuit blocks are not directly connected to the first power bus.

14. The semiconductor IC of claim 10, wherein the first circuit blocks are upstream from the second circuit blocks in a current path such that a current supplied to the second circuit blocks is commonly guided upstream in a current reuse technique.

* * * * *